(12) United States Patent
Park

(10) Patent No.: US 6,391,727 B1
(45) Date of Patent: May 21, 2002

(54) METHOD OF MANUFACTURING A SEMICONDUCTOR DEVICE UTILIZING A $(Al_2O_3)_X$-$(TiO_2)_{1-X}$ GATE DIELECTRIC FILM

(75) Inventor: Dae Gyu Park, Ichon-shi (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/722,351

(22) Filed: Nov. 28, 2000

(30) Foreign Application Priority Data

Dec. 24, 1999 (KR) ............................................. 99-61810

(51) Int. Cl.⁷ ................. H01L 21/4763; H01L 21/8242; H01L 21/302; H01L 21/336; H01L 21/335
(52) U.S. Cl. ...................... 438/287; 438/240; 438/635; 438/720
(58) Field of Search ................................ 438/635, 240, 438/720, 785, 287

(56) References Cited

U.S. PATENT DOCUMENTS

| | | |
|---|---|---|
| 4,397,077 A | 8/1983 | Derbenwick et al. |
| 4,895,520 A | 1/1990 | Berg |
| 5,106,776 A | 4/1992 | Shen et al. |
| 5,219,778 A | 6/1993 | Dennison et al. |
| 5,298,436 A | 3/1994 | Radosevich et al. |
| 5,300,450 A | 4/1994 | Shen et al. |
| 5,405,796 A | 4/1995 | Jones, Jr. |
| 5,679,980 A | 10/1997 | Summerfelt |
| 5,716,875 A | 2/1998 | Jones, Jr. et al. |
| 5,907,780 A | 5/1999 | Gilmer et al. |
| 5,923,056 A | 7/1999 | Lee et al. |
| 5,960,270 A | 9/1999 | Misra et al. |
| 5,998,225 A | 12/1999 | Crenshaw et al. |
| 6,010,927 A | 1/2000 | Jones, Jr. et al. |
| 6,066,525 A | 5/2000 | Liu et al. |
| 6,171,970 B1 | 1/2002 | Xing et al. |

FOREIGN PATENT DOCUMENTS

JP        62-204567        9/1987

OTHER PUBLICATIONS

Kim et al. "Anti-oxidation properties of TiAlN film prepared by plasma-assisted chemical vapor deposition and roles of Al", Thin Solid Films, vol. 307, Issue: 1-2, pp. 113-119, Oct. 10, 1997.

*Primary Examiner*—John F. Niebling
*Assistant Examiner*—Ron Pompey
(74) *Attorney, Agent, or Firm*—Finnegan, Henderson, Farabow, Garrett & Dunner, L.L.P.

(57) ABSTRACT

There is disclosed a method of manufacturing a semiconductor device utilizing a gate dielectric film. The present invention can obtain a $(Al_2O_3)_X$—$(TiO_2)_{1-X}$ gate dielectric film where its the dielectric constant is higher than that of $Al_2O_3$ and its leakage current characteristic is improved compared to $TiO_2$, by depositing a $Ti_{1-X}Al_XN$ film on a semiconductor substrate and then forming the $(Al_2O_3)_X$—$(TiO_2)_{1-X}$ gate dielectric film by oxidization process. Therefore, the present invention can implement a high-speed high-density logic device and an ultra high integration device of more than 1G DRAM class, which utilize a high dielectric material as the gate dielectric film.

14 Claims, 1 Drawing Sheet

METHOD OF MANUFACTURING A SEMICONDUCTOR DEVICE UTILIZING A $(Al_2O_3)_x$-$(TiO_2)_{1-x}$ GATE DIELECTRIC FILM

CROSS-REFERENCE TO RELATED APPLICATION

Priority is claimed from Republic of Korean Patent Application No. 99-61810 filed Dec. 24, 1999, which is incorporated in its entirety by reference.

BACKGROUND OF THE INVENTION

1. Field of the Invention

The invention relates generally to a method of manufacturing a semiconductor device utilizing a gate dielectric film. More particularly, the present invention relates to a method of manufacturing a semiconductor device capable of improving a leakage current characteristic of a gate dielectric film, while increasing its dielectric constant, applied to a high-speed high-density logic device and an ultra high integration device of more than 1G DRAM class, which utilize a high dielectric material as a gate dielectric film.

2. Description of the Prior Art

In general, a gate dielectric film of DRAM devices presently mass-produced and of a logic device in a semiconductor device is used by growing $SiO_2$ by means of annealing process or rapid thermal process. As the design rule is scaled down, a $SiO_2$ gate dielectric film is scaled down to 25~30 Å being a limit to the tunneling effect. It is expected that the gate dielectric of 0.10 μm technology will result in 30~40 Å in thickness. Due to off-current by the tunneling of the gate dielectric film, however, there is a possibility that the static power consumption is increased and its operation performance is adversely affected. Particularly, in case of a memory device, a scheme to reduce a leakage current becomes an important issue. As a part of efforts to overcome this, a research for adopting a dielectric material having a high dielectric constant as a gate dielectric film has been carried out.

Recently, research for using dielectric materials such as $TiO_2$, $Al_2O_3$, etc. as a gate dielectric film has been actively carried out. $Al_2O_3$ has a dielectric constant of 8~15, which is larger about 2.5 times than the dielectric constant of a thermal oxide film, and has a good leakage current characteristic. However, there is a problem that $Al_2O_3$ is utilized as a gate dielectric film since its dielectric constant is degraded depending on its thickness in controlling the thickness (Tox) of the effective oxide film to below 25~30 Å. Also, it is reported that $TiO_2$ has a high dielectric constant of 25~40. However, there is a problem that $TiO_2$ is utilized as a gate dielectric film since its leakage current characteristic is poor.

SUMMARY OF THE INVENTION

It is therefore an object of the present invention to provide a method of manufacturing a semiconductor device capable of improving a leakage current characteristic of a gate dielectric film, while increasing its dielectric constant, applied to a high-speed high-density logic device and an ultra high integration device of more than 1G DRAM class which utilize a high dielectric material as the gate dielectric film.

In order to accomplish the above object, a method of manufacturing a semiconductor device according to the present invention is characterized in that it comprises the steps of depositing a $Ti_{1-x}Al_xN$ film on a semiconductor substrate; oxidizing the $Ti_{1-x}Al_xN$ film by oxidization process to form a $(Al_2O_3)_x$-$(TiO_2)_{1-x}$ gate dielectric film; and forming a gate electrode on the $(Al_2O_3)_x$-$(TiO_2)_{1-x}$ gate dielectric film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
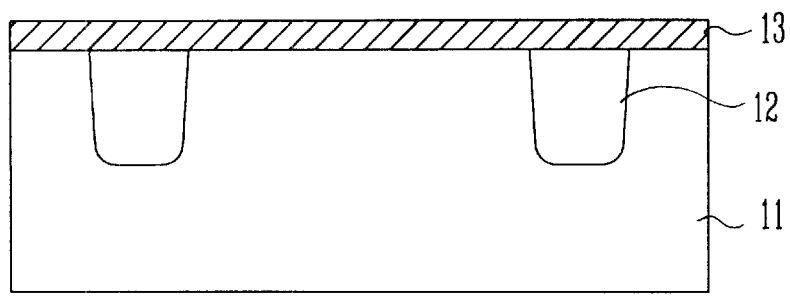
FIGS. 1A and 1C are cross-sectional views of a device for explaining a method of manufacturing a semiconductor device utilizing a gate dielectric film according to a preferred embodiment of the present invention.
Figure 1B:
Figure 1B:
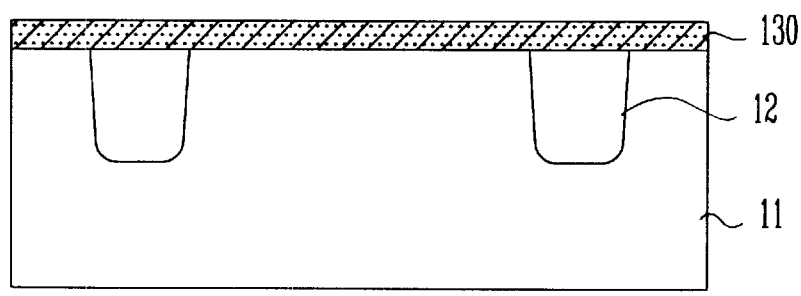
Figure 1C:
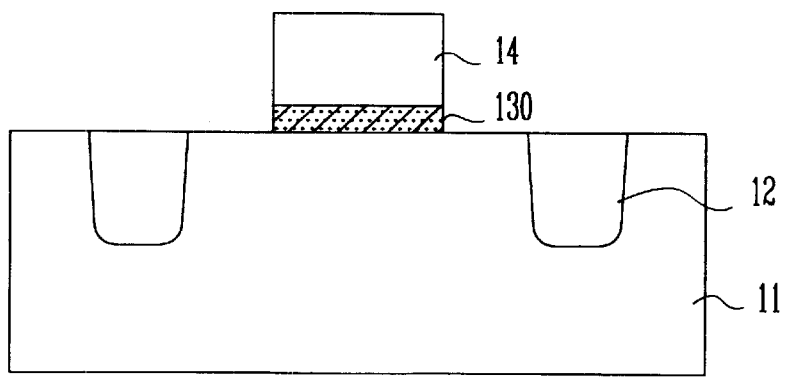

FIGS. 1A and 1C are cross-sectional views of a device for explaining a method of manufacturing a semiconductor device utilizing a gate dielectric film according to a preferred embodiment of the present invention.

Referring now to FIG. 1A, a device separation film 12 is formed in a semiconductor substrate 11, thus defining an active region. Then, a $Ti_{1-x}Al_xN$ film 13 is deposited on the semiconductor substrate in which the device separation 12 is formed.

In the above, the device separation film 12 may be formed in a LOCOS structure or a STI structure. The $Ti_{1-x}Al_xN$ film 13 is deposited in thickness of 20~150 Å by use of physical vapor deposition (PVD) method or chemical vapor deposition (CVD) method.

In case that the $Ti_{1-x}Al_xN$ film 13 is deposited by PVD method, two methods may be employed depending on their deposition conditions. Firstly, in a target composition of $TiAl_x$ in which the composition 'X' is 0.25~0.35, in case that the $Ti_{1-x}Al_xN$ film 13 is deposited by PVD method using a nitrogen reactive sputtering, the deposition conditions are as follows: a power of 500 W~7 kW (in case of the chamber for 8 inch) is applied, the flow rate of $N_2$ is 20~80 sccm, the flow rate of Ar is 5~25 sccm and the deposition temperature is in the range of –30~500° C. Secondly, in a target composition of TiAlN in which the composition of AlN is 25~35%, in case that the $Ti_{1-x}Al_xN$ film 13 is deposited by PVD method using sputtering, a DC or a RF bias is applied and Ar, Xe, Kr, etc. are used as a sputtering gas.

In case that the $Ti_{1-x}Al_xN$ film 13 is deposited by CVD method, two methods may be employed depending on their conditions. Firstly, in case that the $Ti_{1-x}Al_xN$ film 13 is deposited by CVD method using a thermal oxidization method, the deposition conditions are as follows: $TiCl_4$, TDMAT, etc. are used as a Ti source material, $AlCl_3$, $Al(CH_3)_3$, etc. are used as an Al source material, $NH_3$, $ND_3$, $N_2$, etc. are used as a N source material and its deposition temperature is in the range of 450~700° C., wherein the composition of AlN is controlled to be 25~35%. Secondly, in case that the $Ti_{1-x}Al_xN$ film 13 is deposited by CVD using ECR (Electron Cyclotron Resonance) employing a remote plasma of 2~9 GHz or a RF of 13.56 MHz, the depositions are as follows: $TiCl_4$, TDMAT, etc. are used as a Ti source material, $AlCl_3$, $Al(CH_3)_3$, etc. are used as an Al source material and $NH_3$, $ND_3$, $N_2$, etc. are used as a N source material, wherein the composition of AlN is controlled to be 25~35%.

Meanwhile, before the $Ti_{1-x}Al_xN$ film 13 is deposited, the following processes may be implemented.

Firstly, before the $Ti_{1-x}Al_xN$ film 13 is deposited, a trench capacitor structure may be formed. At this time, oxide/nitride or $Ta_2O_5$, $Al_2O_3$, BST, SBT are used as a dielectric film of a capacitor.

Secondly, before the $Ti_{1-x}Al_xN$ film 13 is deposited, pirahna, RCA cleaning process may be performed in order to remove a $SiO_2$ film having a bad film quality on the surface of the semiconductor substrate 11.

Thirdly, before the $Ti_{1-x}Al_xN$ film 13 is deposited, a $SiO_2$ film having a good film quality is formed in thickness of 3~20 Å on the surface of the semiconductor substrate 11 in order to improve the interfacial property between the semiconductor substrate 11 and the $Ti_{1-x}Al_xN$ film 13. As the $SiO_2$ film having a good film quality is an thermal oxide film by furnace, it may be formed at the temperature of 650~900° C. by wet or dry method, or may be formed by rapid thermal process having the chamber temperature of 700~900° C. under $O_2$ atmosphere or $N_2O$ atmosphere at a constant pressure or a reduced pressure of 0.1~100 Torr.

Referring now to FIG. 1B, the $Ti_{1-x}Al_xN$ film 13 is oxidized by oxidization process to form a $(Al_2O_3)_x$—$(TiO_2)_{1-x}$ gate dielectric film 130. Here, the composition 'X' is 0.25~0.35 in a $(Al_2O_3)_x$—$(TiO_2)_{1-x}$ gate dielectric film 130.

In the above, the oxidization process may include annealing under $O_2$ or $N_2O$ atmosphere using a furnace anneal for 20 seconds ~5 minutes, performing a plasma process using plasma under $O_2$ or $N_2O$ atmosphere at the temperature of 350~650° C. or annealing using $UV/O_3$ under $O_2$ or $N_2O$ atmosphere at the temperature of 350~550° C. for 5~30 minutes.

Meanwhile, in order to improve the film quality of the $(Al_2O_3)_x$—$(TiO_2)_{1-x}$ gate dielectric film 130, it may be experienced by annealing process using the furnace anneal under $O_2$, $N_2$ and $N_2O$ atmosphere at the temperature of 650~800° C. for 10~60 minutes or by rapid thermal process under $O_2$, $N_2$ and $N_2O$ atmosphere with the condition of ramp rate having 20~80° C./sec at the temperature of 600~900° C. for 10~120 seconds.

Referring now to FIG. 1C, a gate electrode 14 is formed on the $(Al_2O_3)_x$—$(TiO_2)_{1-x}$ gate dielectric film 130, thus forming a semiconductor device having a gate dielectric structure.

In the above, the gate electrode 14 may be formed of a polysilicon structure, a polycide structure such as tungsten polycide (W-polycide), titanium polycide (Tipolycide), molybdenum polycide (Mo-polycide), cobalt polycide (Co-polycide), etc., metal structures such as tungsten (W), tantalum (Ta), tungsten nitride (WN), tantalum nitride (TaN), etc., which are used conventionally.

As mentioned above, the present invention relates to a technology of forming a $(Al_2O_3)_x$—$(TiO_2)_{1-x}$ gate dielectric film in which $TiO_2$ and $Al_2O_3$ are mixed as a gate dielectric film of a semiconductor device, wherein the gate dielectric film is higher in the dielectric constant than $Al_2O_3$ and its leakage current characteristic is improved compared to $TiO_2$.

In other words, in the $(Al_2O_3)_x$—$(TiO_2)_{1-x}$ gate dielectric film, the dielectric constant and the leakage current characteristic can be adjusted by controlling the composition 'X' of 0.25~0.35. At this time if $TiO_2$ is 65~75% and $Al_2O_3$ is 25~35%, the dielectric constant is increased to 18~20 and the leakage current characteristic can be also improved. The $(Al_2O_3)_x$—$(TiO_2)_{1-x}$ gate dielectric film is formed by depositing a $SiO_2$ film with the ultra thin thickness of 3~20 Å, then depositing a $Ti_{1-x}Al_xN$ film by PVD method or CVD method and performing oxidization process under various conditions.

Advantage of using oxidization of the $Ti_{1-x}Al_xN$ film is that it can control a micro-structure of a thin film, depending on the deposition conditions such as deposition temperature, power, flow rate of gas, etc. For example, if the $Ti_{1-x}Al_xN$ film is deposited a low temperature of below 100° C., it is deposited in an amorphous phase of nano crystalline. On the other hand, if is deposited at a high temperature of more than 400° C., it is deposited in a preferred orientation phase of (200) NaCl structure. If the $Ti_{1-x}Al_xN$ film deposited by low temperature deposition process is oxidized, it has a mixed phase in which (101) rutile and (400) anatase $TiO_2$ are mixed. If the $Ti_{1-x}Al_xN$ film deposited by high temperature deposition process is oxidized, it has a $(Al_2O_3)_x$—$(TiO_2)_{1-x}$ compound in which a (400) anatase $TiO_2$ phase of a preferred orientation is intact viewed.

As mentioned above, the present invention can implement a high-speed highdensity device having a good leakage current characteristic, by utilizing a $(Al_2O_3)_x$-$(TiO_2)_{1-x}$ gate dielectric film having a high dielectric constant when forming a next-generation gate.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising:
   depositing a $Ti_{1-x}Al_xN$ film on a semiconductor substrate;
   oxidizing the $Ti_{1-x}Al_xN$ film by an oxidization process to form a $(Al_2O_3)_x$—$(TiO_2)_{1-x}$ gate dielectric film; and
   forming a gate electrode on the $(Al_2O_3)_x$—$(TiO_2)_{1-x}$ gate dielectric film.

2. The method according to claim 1, comprising depositing said $Ti_{1-x}Al_xN$ film by a physical vapor deposition method using nitrogen reactive sputtering, said sputtering comprising applying a power of approximately 500 W to approximately 7 kW, using a flow rate of $N_2$ of approximately 20 to approximately 80 sccm, using a flow rate of Ar of 5~25 sccm, using a deposition temperature in the range of approximately −30 to approximately 500° C., and a target composition comprising $TiAl_x$, wherein 'X' is approximately 0.25 to approximately 0.35.

3. The method according to claim 1, comprising depositing said $Ti_{1-x}Al_xN$ film by a physical vapor deposition method using sputtering, said sputtering comprising applying one of a DC and a RF bias, using as a sputtering gas one of Ar, Xe and Kr, and using a target composition comprising TiAlN, wherein a concentration of AlN is approximately 25 to approximately 35%.

4. The method according to claim 1, comprising depositing said $Ti_{1-x}Al_xN$ film by a chemical vapor deposition method using a thermal oxidization method, said method comprising using a Ti source material chosen from $TiCl_4$ and TDMAT, an Al source material chosen from $AlCl_3$ and $Al(CH_3)_3$, a N source material chosen from $NH_3$, $ND_3$ and $N_2$ and a deposition temperature in the range of approximately 450 to approximately 700° C., such that a concentration of AlN is controlled to be approximately 25 to approximately 35%.

5. The method according to claim 1, comprising depositing said $Ti_{1-x}Al_xN$ film by chemical vapor deposition using ECR employing one of a remote plasma of approximately 2 to approximately 9 GHz and a RF of 13.56 MHz, said deposition comprising a Ti source material chosen from $TiCl_4$, and TDMAT, an Al source material chosen from $AlCl_3$, and $Al(CH_3)_3$, and an N source material chosen from $NH_3$, $ND_3$, and $N_2$, wherein a concentration of AlN is controlled to be approximately 25 to approximately 35%.

6. The method according to claim 1, further comprising forming a $SiO_2$ film having a thickness of approximately 3 to approximately 20 Å on said semiconductor substrate prior to depositing said $Ti_{1-x}Al_xN$ film, in order to improve interfacial property between said semiconductor substrate and said $Ti_{1-x}Al_xN$ film.

7. The method according to claim 6, wherein forming said $SiO_2$ film comprises using one of a wet or dry method at the temperature of approximately 650 to approximately 900° C., and a rapid thermal process in a chamber having the temperature of 700~900° C. under an atmosphere comprising one of $O_2$ and $N_2O$ at one of a constant pressure and a reduced pressure of approximately 0.1 to approximately 100 Torr.

8. The method according to claim 1, wherein said oxidization process for forming said $(Al_2O_3)_X$—$(TiO_2)_{x-1}$ gate dielectric film is performed under an atmosphere comprising one of $O_2$ and $N_2O$ using a furnace anneal for approximately 20 seconds to approximately 5 minutes.

9. The method according to claim 1, wherein said oxidization process for forming said $(Al_2O_3)_X$—$(TiO_2)_{x-1}$ gate dielectric film comprises using a plasma process under an atmosphere comprising one of $O_2$ and $N_2O$ using a plasma at the temperature of approximately 350 to approximately 650° C.

10. The method according to claim 1, wherein said oxidization process for forming said $(Al_2O_3)_X$—$(TiO_2)_{X-1}$ gate dielectric film comprises annealing under an atmosphere comprising one of $O_2$ and $N_2O$ using $UV/O_3$ at the temperature of approximately 350 to approximately 550° C. for approximately 5 to approximately 30 minutes.

11. The method according to claim 1, further comprising processing using a furnace anneal under an atmosphere comprising one of $O_2$, $N_2$ and $N_2O$ at the temperature of 650~800° C. for approximately 10 to approximately 60 minutes in order to improve a film quality of said $(Al_2O_3)_X$—$(TiO_2)_{X-1}$ gate dielectric film.

12. The method according to claim 1, further comprising performing a rapid thermal process under an atmosphere comprising one of $O_2$, $N_2$ and $N_2O$ with the condition of a ramp rate having approximately 20 to approximately 80° C./sec at the temperature of approximately 600 to approximately 900° C. for approximately 10 to approximately 120 seconds in order to improve a film quality of the $(Al_2O_3)_X$—$(TiO_2)_{1-X}$ gate dielectric film.

13. The method according to claim 1, wherein in said $(Al_2O_3)_X$—$(TiO_2)_{X-1}$ gate dielectric film 'X' ranges from approximately 0.25 to approximately 0.35.

14. The method according to claim 1, wherein said gate electrode comprises a polysilicon structure, a polycide structure chosen from tungsten polycide, titanium polycide, molybdenum polycide and cobalt polycide, and a metal structure chosen from tungsten, tantalum, tungsten nitride, and tantalum nitride.

* * * * *